United States Patent
Chang et al.

(10) Patent No.: US 12,470,222 B2
(45) Date of Patent: Nov. 11, 2025

(54) DIGITAL DUTY CYCLE CALIBRATION

(71) Applicant: RENESAS ELECTRONICS AMERICA INC., Milpitas, CA (US)

(72) Inventors: Dong-Young Chang, San Jose, CA (US); Steven Ernest Finn, Atlanta, GA (US); Dominic Wingkin Yip, Fremont, CA (US)

(73) Assignee: RENESAS ELECTRONICS AMERICA INC., Milpitas, CA (US)

( * ) Notice: Subject to any disclaimer, the term of this patent is extended or adjusted under 35 U.S.C. 154(b) by 71 days.

(21) Appl. No.: 18/516,084

(22) Filed: Nov. 21, 2023

(65) Prior Publication Data

US 2025/0167788 A1    May 22, 2025

(51) Int. Cl.
*H03L 7/08*    (2006.01)
*H03K 3/017*   (2006.01)
*H03K 5/01*    (2006.01)
*H03K 5/00*    (2006.01)

(52) U.S. Cl.
CPC .............. *H03L 7/08* (2013.01); *H03K 3/017* (2013.01); *H03K 5/01* (2013.01); *H03K 2005/00286* (2013.01)

(58) Field of Classification Search
CPC ... H03K 19/018521; H03K 19/018507; H03K 19/018528; H03K 19/0185; G06F 30/392; G06F 2119/06; G06F 30/39
See application file for complete search history.

(56) References Cited

U.S. PATENT DOCUMENTS

2011/0215851 A1*  9/2011  Oh ............................ H03L 7/07
                                                                327/158

\* cited by examiner

*Primary Examiner* — Jung Kim
(74) *Attorney, Agent, or Firm* — SCULLY, SCOTT, MURPHY & PRESSER, P.C.

(57) ABSTRACT

Systems and methods for calibrating a clock signal are described. A device can include a processer, a circuit and a system duty cycle control (DCC) circuit. The circuit can perform a first phase shift on a clock signal to generate a first phase-shifted signal. The circuit can perform a second phase shift on the clock signal to generate a second phase-shifted signal. The circuit can perform a fixed DCC on the first phase-shifted signal to generate a first voltage signal. The circuit can sweep the second phase-shifted signal at a range of duty cycles to generate a second voltage signal. The circuit can sample an output clock signal at a time where the first voltage signal and the second voltage signal overlaps. The processor can generate a digital code based on the output clock signal. The system DCC circuit can calibrate the clock signal using the digital code.

20 Claims, 13 Drawing Sheets

DIGITAL DUTY CYCLE CALIBRATION

BACKGROUND

The present disclosure relates in general to systems and methods for duty cycle calibration. Particularly, a digital duty cycle calibration system using one or more digital duty cycle monitors (DCMs) is used for calibrating duty cycle of a clock.

Data processing applications can be dependent on clock signals for synchronization. Clock cycles of the clock signals can be maintained at a target duty cycle, such as 50%. Due to various mismatches, such as process, voltage and temperature (PVT) mismatches, can cause the clock cycle to vary and deviate from the target duty cycle. The clock signals can be calibrated to maintain the clock cycle at the target duty cycle. In an aspect, a duty cycle calibration system can use feedback of the clock signals to determine calibration factors that can calibrate clock signals and maintain the clock signals at the target duty cycle.

SUMMARY

In one embodiment, a semiconductor device that can implement a digital duty cycle calibration system is generally described. The semiconductor device can include a processor. The semiconductor device can further include a system duty cycle control (DCC) circuit configured to generate a clock signal. The semiconductor device can further include a circuit configured to perform a first phase shift on a clock signal to generate a first phase-shifted signal. The circuit can further perform a second phase shift on the clock signal to generate a second phase-shifted signal. The circuit can further perform a fixed DCC on the first phase-shifted signal to generate a first voltage signal. The circuit can further sweep the second phase-shifted signal at a range of duty cycles to generate a second voltage signal. The circuit can further sample an output clock signal at a time in which the first voltage signal and the second voltage signal overlaps. The processor can be configured to generate a digital code based on the output clock signal. The system DCC circuit can further be configured to calibrate the clock signal using the digital code.

In one embodiment, a semiconductor device that can implement a digital duty cycle calibration system is generally described. The semiconductor device can include a first phase shifter configured to perform a first phase shift on a clock signal to generate a first phase-shifted signal. The semiconductor device can further include a second phase shifter configured to perform a second phase shift on the clock signal to generate a second phase-shifted signal. The semiconductor device can further include a first duty cycle control (DCC) circuit configured to perform a fixed DCC on the first phase-shifted signal to generate a first voltage signal. The semiconductor device can further include a second DCC circuit configured to sweep the second phase-shifted signal at a range of duty cycles to generate a second voltage signal. The semiconductor device can further include a phase detector configured to sample an output clock signal at a time in which the first voltage signal and the second voltage signal overlaps. The calibration of the clock signal can be based on the output clock signal.

In one embodiment, a method for calibrating a clock signal is generally described. The method can include performing a first phase shift on a clock signal to generate a first phase-shifted signal. The method can further include performing a second phase shift on the clock signal to generate a second phase-shifted signal. The method can further include performing a fixed DCC on the first phase-shifted signal to generate a first voltage signal. The method can further include sweeping the second phase-shifted signal at a range of duty cycles to generate a second voltage signal. The method can further include sampling an output clock signal at a time in which the first voltage signal and the second voltage signal overlaps. The calibration of the clock signal can be based on the output clock signal.

Further features as well as the structure and operation of various embodiments are described in detail below with reference to the accompanying drawings. In the drawings, like reference numbers indicate identical or functionally similar elements.

DETAILED DESCRIPTION

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

In an aspect, duty cycle calibration system can be implemented by analog circuitry for continuously monitoring duty cycle of clock signals in a circuit. The analog duty cycle calibration systems can perform feedback loop control to provide correction factor or direction to the clock signals until the target duty cycle is reached. However, analog duty cycle calibration systems may require start up time to settle to a reasonably accurate state before the calibration starts. Also, in analog duty cycle calibration systems, the calibration accuracy can be dependent on the accuracy of the analog circuitry that has its own performance variation due to PVT mismatches.

In an aspect, digital duty cycle calibration systems that use open loop can detect one of the clock edges using its own clock and performs interpolation using logic gates, but it requires an extra transition edge and not all applications can generate the extra transition edge. The interpolation can also cause the edges to lag and become prone to jittering, coupling and can impact duty cycle accuracy. In another aspect, digital duty cycle calibration systems that use incoming clock pulse generator and half cycle delay line can create pulses with half cycles but the need to create the pulses may be challenging, especially when pulse width gets narrower for high-speed clock applications (e.g., difficult to create half of a narrow pulse width). In another aspect, digital duty cycle calibration systems that use feedback and state machines to create the clock can be relatively complicated and can have significant power consumption.

Figure 1:
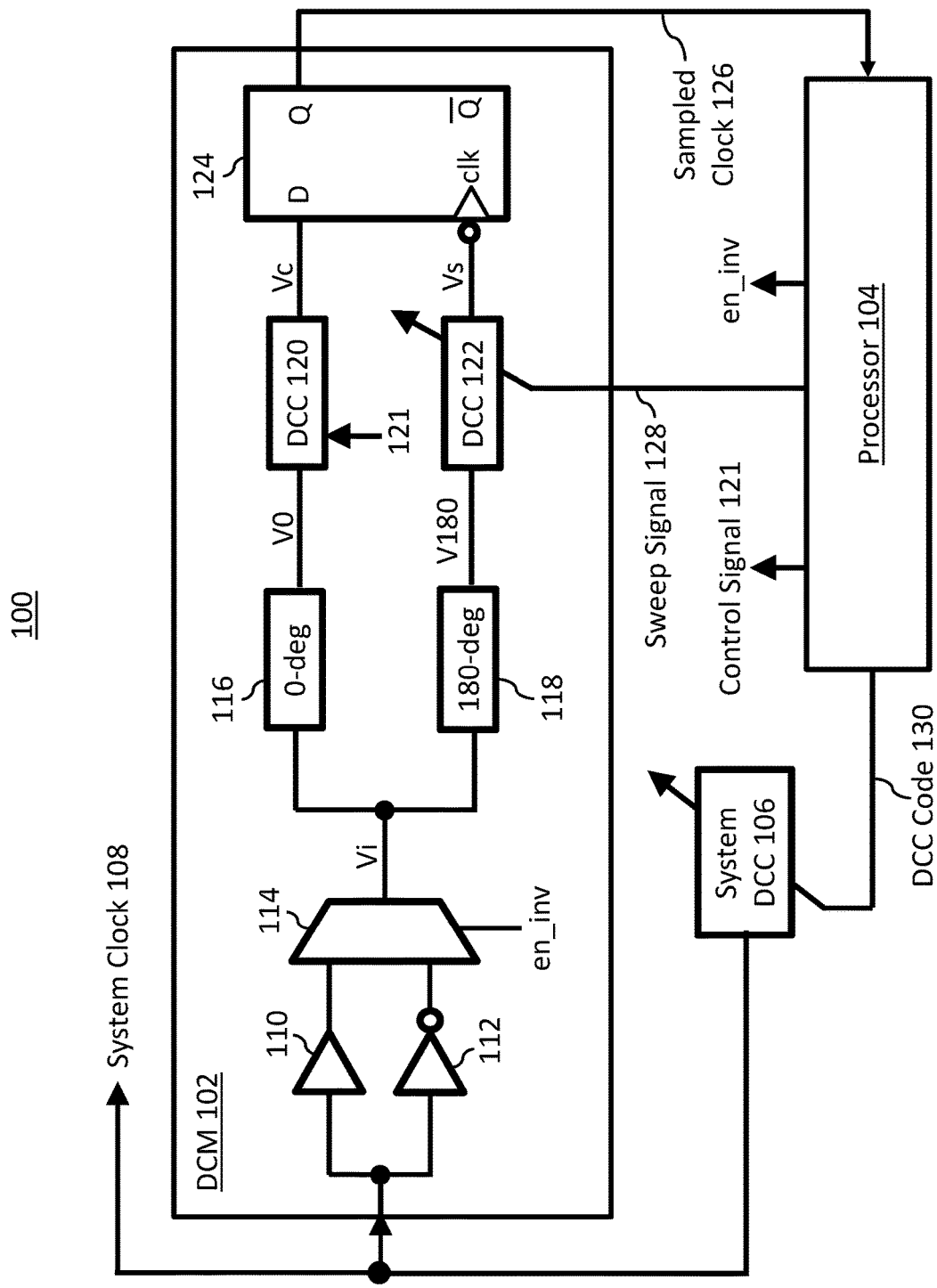
FIG. 1 is a diagram showing an example system that can implement digital duty cycle calibration in one embodiment.

FIG. 1 is a diagram showing an example system that can implement adaptive zero voltage switching for near field communication in one embodiment. System 100 can be a duty cycle calibration system including at least a duty cycle monitor (DCM) 102, a processor 104 and a system duty cycle control (DCC) circuit 106. Processor 104 can be, for example, a processor in a microcontroller. Processor 104 can be configured to run various applications, such as a state machine. System DCC circuit 106 can be configured to generate a clock signal labeled as system clock 108. System DCC circuit 106 can receive a DCC code 130 from processor 104 and generate and calibrate system clock 108 using DCC code 130. DCC code 130 can be a digital code indicating an amount of calibration to be made to system clock 108. In the embodiment shown in FIG. 1, system clock 108 can be a single-ended signal.

DCM 102 can be a digital circuit implemented by one or more semiconductor devices, such as integrated circuits (ICs) and can include digital circuit components. DCM 102 can include at least a buffer 110, an inverter 112, a multiplexer (MUX) 114, a phase shifter 116, a phase shifter 118, a DCC circuit 120, a DCC circuit 122 and a phase detector being implemented by a D flip-flop (DFF) 124. DCM 102 can receive system clock 108 from system DCC circuit 106. System clock 108 can be distributed to buffer 110 and inverter 112. Buffer 110 can pass system clock 108 to a first input pin of MUX 114. Inverter 112 can invert system clock 108 and provide the inverted system clock 108 to a second input pin of MUX 114. An enable invert (en_inv) signal can be provided by processor 104. When the en_inv signal is low, MUX 114 can select the system clock 108 provided from buffer 110 and output the selected system clock 108 as a voltage signal Vi. When the en_inv signal is high, MUX 114 can select the inverted system clock 108 provided from inverter 112 and output the selected inverted system clock 108 as voltage signal Vi.

Voltage signal Vi can be distributed to phase shifters 116 and 118. In one embodiment, phase shifter 116 can be a zero-degree phase shifter. Phase shifter 116 can receive voltage signal Vi and perform a zero-degree phase shift on voltage signal Vi to generate a voltage signal V0. In one embodiment, phase shifter 118 can be a 180-degree phase shifter. Phase shifter 118 can receive voltage signal Vi and perform a 180-degree phase shift on voltage signal Vi to generate a voltage signal V180. Voltage signal V0 can be provided to DCC circuit 120 and voltage signal V180 can be provided to DCC circuit 122. In one embodiment, voltage signal V0, voltage signal Vi and system clock 108 being input to DCM 102 can be identical, such as having their rising edged and falling edges aligned.

DCC circuit 120 can perform duty cycle control on voltage signal V0 to generate a voltage signal labeled as Vc. In one embodiment, processor 104 can send a control signal 121 to DCC circuit 120. Control signal 121 can include a DCC code for calibrating the duty cycle of voltage signal Vc. In one embodiment, control signal 121 can be a fixed DCC code and can be fixed at middle code or mid-code (e.g., middle of a control range of DCC circuit 120). When control signal 121 is fixed at middle code, DCC 120, the duty cycle of the output voltage (e.g., voltage signal Vc) can follow or can be identical to the duty cycle of the input voltage (e.g., voltage signal V0).

DCC circuit 122 can perform duty cycle control on voltage signal V180 to generate a voltage signal labeled as Vs. In one embodiment, processor 104 can send a control signal, labeled as sweep signal 128, to DCC circuit 122. Sweep signal 128 can include a plurality of DCC codes for performing a sweep of duty cycle calibrations across a range of duty cycles. By way of example, the sweep of duty cycle calibrations can be a plurality of duty cycle calibrations being performed by DCC circuit 122 to calibrate voltage signal V180 at a plurality of different duty cycles in the range of duty cycles. In one embodiment, the range of duty cycles can be predefined and can include the fixed DCC code of DCC circuit 120.

The voltage signal Vc can be provided to the D pin of DFF 124 and the voltage signal Vs can be provided to the clock (clk) pin of DFF 124. When Vs is low, the output Q of DFF 124 can be unchanged. When Vc is low and Vs is high, the output Q of DFF 124 can be low. When Vc is high and Vs is high, the output Q of DFF 124 can be high. Therefore, when voltage signals Vc and Vs overlap, or when they are both high, output Q can output a sampled clock 126. Sampled clock 126 can indicate the time in which voltage signals Vc and Vs overlap.

To calibrate system clock 108, system 100 can perform a 2-step calibration process. In a first step, MUX 114 can select system clock 108 provided by buffer 110 (e.g., en_inv is disabled), voltage signal Vi can go through the components in DCM 102. In the first step, DFF 124 can output sampled clock 126 that is sampled at a first time in which voltage signals Vc and Vs overlap under the setting where system clock 108 was selected by MUX 114. Then in a second step, MUX 114 can select the inverse system clock 108 provided by inverter 112 (e.g., en_inv is enabled), voltage signal Vi can go through the components in DCM 102. In the second step, DFF 124 can output sampled clock 126 that is sampled at a second time in which voltage signals Vc and Vs overlap under the setting where the inverse of system clock 108 was selected by MUX 114.

Processor 104 can receive the first time in the first step, receive the second time in the second step, and determine DCC code 130 based on the first time and the second time. In one embodiment, processor 104 can determine a difference between the first time and the second time and determine DCC code 130 based on the determined difference. System DCC circuit 106 can use DCC code 130 to adjust or calibrate system clock 108, and the calibrated version of system clock 108 can be provided to DCM 102 for another calibration. The 2-step calibration process performed by system 100 can be a closed control loop and system clock 108 can be continuously monitored and calibrated. System 100 can be implemented without using analog circuitry that may require initial start-up or settling time and the digital circuitry in DCM 102 can reduce an overall calibration time and power consumption.

Figure 2:
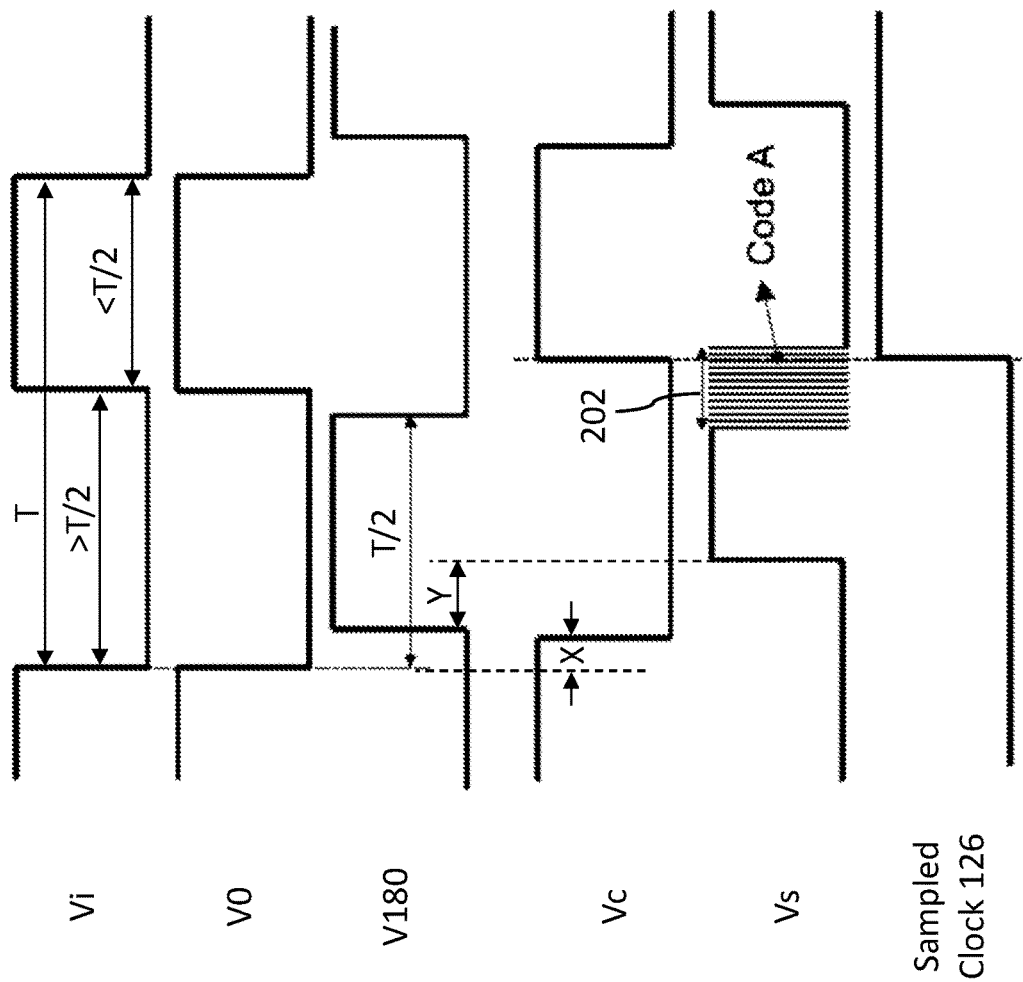
FIG. 2 is a diagram showing a plurality of signals in a first portion of an example implementation of digital duty cycle calibration in one embodiment.

FIG. 2 is a diagram showing a plurality of signals in a first portion of an example implementation of digital duty cycle calibration in one embodiment. Descriptions of FIG. 2 can reference components that are shown in FIG. 1. Waveforms of various signals in a first portion or first step of a calibration process that can be performed by system 100 (see FIG. 1) are shown in FIG. 2. The example waveforms in FIG. 2 correspond to the first step of the calibration process described here, where MUX 114 selects system clock 108 buffered by buffer 110. Hence, the voltage signal Vi shown in FIG. 2 can be identical to system clock 108.

Vi can be inputted to phase shifter 116 and phase shifter 116 can perform a zero-degree phase shift on Vi, resulting in the voltage signal V0 that can be identical to Vi (and identical to system clock 108). In the example shown in FIG. 2, the voltage signal Vi has a duty cycle that is less than 50% since the amount of time Vi is ON or HIGH is less than half the clock cycle of system clock 108, or less than T/2 where T is the clock cycle. Vi can also be inputted to phase shifter 118 and phase shifter 118 can perform a 180-degree phase shift on Vi, resulting in the voltage signal V180 that can be out of phase with V0 by T/2.

DCC 120 can receive voltage signal V0 and perform duty cycle control on voltage signal V0 to generate voltage signal Vc. In one embodiment, the control signal 121 for DCC circuit 120 can be fixed at middle code such that the duty cycle of voltage signal Vc can follow or can be identical to the duty cycle of the voltage signal V0. Also, DCC circuit 120 can delay voltage signal V0 by a predefined amount to generate Vc, such that Vc is out of phase with V0 by a factor of X as shown in FIG. 2.

DCC 122 can receive voltage signal V180 and perform duty cycle control on voltage signal V180 to generate voltage signal Vs. In one embodiment, DCC circuit 122 can delay voltage signal V180 by a predefined amount to generate Vs, such that Vs is out of phase with V180 by a factor of Y as shown in FIG. 2. The delay factor Y can be greater than the delay factor X. In one embodiment, sweep signal 128 being provided to DCC circuit 122 can include a plurality of control signals. Each one of the plurality of control signals can be for controlling DCC circuit 122 to generate voltage signal Vs to have a specific duty cycle. A range 202 of duty cycles can be indicated in sweep signal 128. DCC circuit 122 can perform the sweep by calibrating Vs at each one of the duty cycles in range 202. Calibrating Vs at different duty cycles can include changing the duty cycle of Vs by changing the time of the falling edge of Vs, from the lowest duty cycle in range 202 to the highest duty cycle in range 202.

Voltage signal Vc, and the voltage signal Vs being swept at different duty cycles, can be fed into DFF 124. As shown in FIG. 2, when Vs is low, sampled clock 126 being sampled by DFF 124 can remain unchanged regardless of changes in Vc. When Vc is low and Vs is high, the sampled clock 126 can be low. When Vc is high and Vs is high, the rising edge of sampled clock 126 can be triggered. Processor 104 can detect the rising edge of sampled clock 126 and record the detection, or store a time in which the rising edge was triggered, as a digital code labeled as Code A in FIG. 2. Processor 104 can record or store Code A in a memory device that can be part of processor 104. After receiving and storing code A, system 100 can proceed to the second step of the calibration process, which is shown and described in FIG. 3.

Figure 3:
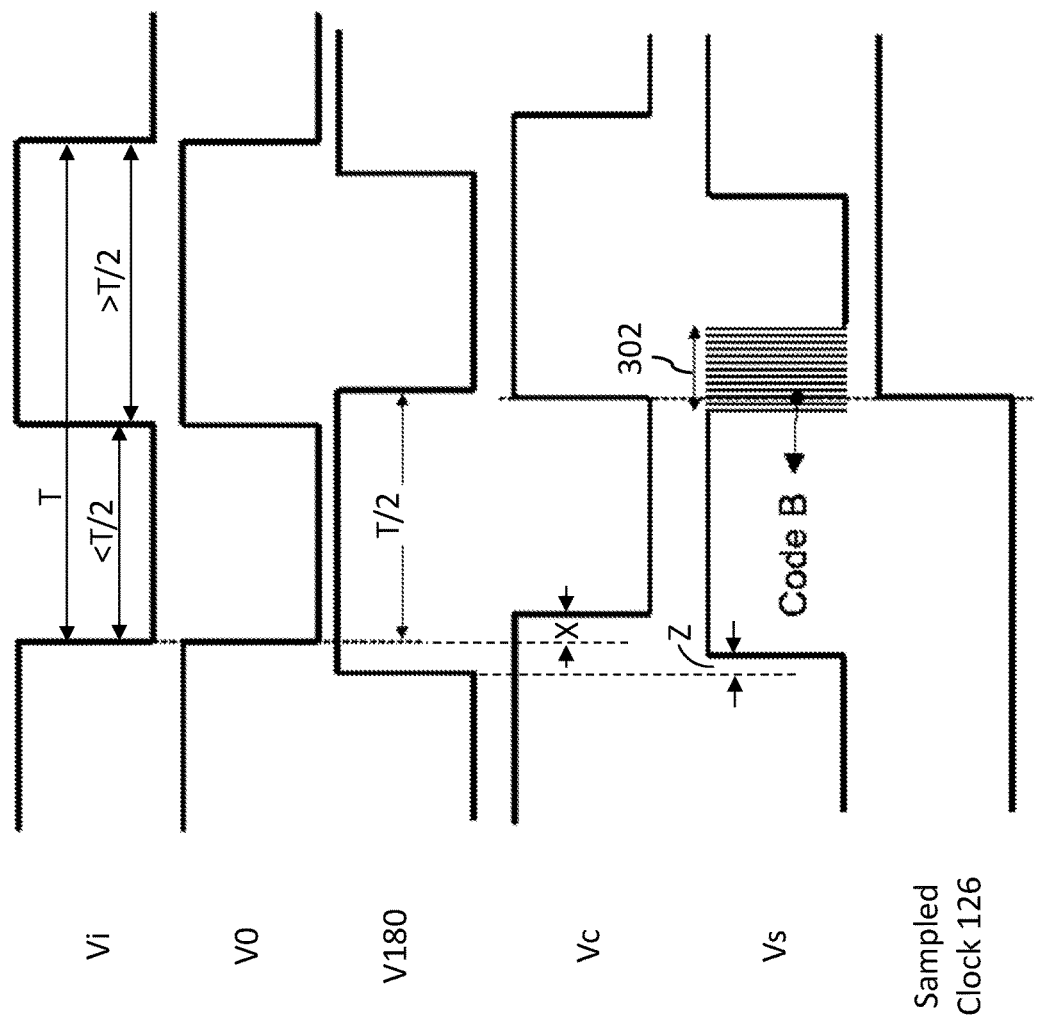
FIG. 3 is a diagram showing a plurality of signals in a second portion of the example implementation of digital duty cycle calibration shown in FIG. 2 in one embodiment.

FIG. 3 is a diagram showing a plurality of signals in a second portion of the example implementation of digital duty cycle calibration shown in FIG. 2 in one embodiment. Descriptions of FIG. 3 can reference components that are shown in FIG. 1 and FIG. 2. Waveforms of various signals in a second portion or second step of a calibration process that can be performed by system 100 (see FIG. 1) are shown in FIG. 3. The example waveforms in FIG. 3 correspond to the second step of the calibration process described herein, where MUX 114 selects the inverse of system clock 108 provided by inverter 112. Hence, the voltage signal Vi shown in FIG. 3 can be an inverse of system clock 108.

Vi can be inputted to phase shifter 116 and phase shifter 116 can perform a zero-degree phase shift on Vi, resulting in the voltage signal V0 that can be identical to Vi (and identical to the inverse of system clock 108). In the example shown in FIG. 3, the voltage signal Vi has a duty cycle that is greater than 50% since the amount of time Vi is ON or HIGH is greater than T/2. Note that a sum of the duty cycle of Vi in FIG. 2 and the duty cycle of Vi in FIG. 3 can be equivalent to T. Vi can also be inputted to phase shifter 118 and phase shifter 118 can perform a 180-degree phase shift on Vi, resulting in the voltage signal V180 that can be out of phase with V0 by T/2.

DCC 120 can receive voltage signal V0 and perform duty cycle control on voltage signal V0 to generate voltage signal Vc. In one embodiment, the control signal 121 for DCC circuit 120 can be fixed at middle code such that the duty cycle of voltage signal Vc can follow or can be identical to the duty cycle of the voltage signal V0. Also, DCC circuit 120 can delay voltage signal V0 by a predefined amount to generate Vc, such that Vc is out of phase with V0 by a factor of X as shown in FIG. 3. The factor X shown in FIG. 3 can be identical to the factor X shown in FIG. 2.

DCC 122 can receive voltage signal V180 and perform duty cycle control on voltage signal V180 to generate voltage signal Vs. In one embodiment, DCC circuit 122 can delay voltage signal V180 by a predefined amount to generate Vs, such that Vs is out of phase with V180 by a factor of Z as shown in FIG. 3. The delay factor Z can be less than the delay factor X. In one embodiment, sweep signal 128 being provided to DCC circuit 122 can include a plurality of control signals. Each one of the plurality of control signals can be for controlling DCC circuit 122 to generate voltage signal Vs to have a specific duty cycle. A range 302 of duty cycles can be indicated in sweep signal 128. DCC circuit 122 can perform the sweep by calibrating Vs at each one of the duty cycles in range 302. Calibrating Vs at different duty cycles can include changing the duty cycle of Vs by changing the time of the falling edge of Vs, from the lowest duty cycle in range 302 to the highest duty cycle in range 302.

Voltage signal Vc, and the voltage signal Vs being swept at different duty cycles, can be fed into DFF 124. As shown in FIG. 2, when Vs is low, sampled clock 126 being sampled by DFF 124 can remain unchanged regardless of changes in Vc. When Vc is low and Vs is high, the sampled clock 126 can be low. When Vc is high and Vs is high, the rising edge of sampled clock 126 can be triggered. Processor 104 can detect the rising edge of sampled clock 126 and record the detection, or store a time in which the rising edge was triggered, as a digital code labeled as Code B in FIG. 3. Processor 104 can record or store Code B in the memory device that can be part of processor 104. After receiving and storing code B, processor 104 can determine DCC code 130 based on Code A and Code B.

In one embodiment, DCC code 130 can be equivalent to half of a difference between Code A and Code B, or (Code A−Code B)/2. DCC code 130 can be zero, a positive value (e.g., greater than zero) or a negative value (less than zero). DCC code 130 being zero, positive or negative can determine the amount of adjustment being made by system DCC circuit 106 to system clock 108. By way of example, if system clock 108 has a 50% duty cycle, both Code A and Code B will be detected at the mid-code (e.g., the middle) of ranges 202, 302, respectively, resulting in Code A−Code B=0. DCC code 130 can be zero and system DCC circuit 106 may maintain system clock 108.

If system clock 108 has a duty cycle that is less than 50%, then Code A in the first step can be increased from (e.g., later than) the mid-code of range 202. Further, the voltage signal Vs can start sweeping earlier when compared to a system clock having a larger duty cycle but under 50%. In other words, as the duty cycle that is less than 50% deviates away from 50%, the start time of the sweep can be earlier or further from the mid-code of range 202. Also, if system clock 108 has the duty cycle less than 50%, then Code B in the second step can be decreased from (earlier than) the mid-code of range 302. Therefore, when system clock 108 has the duty cycle less than 50%, the difference Code A−Code B can be a positive number (e.g., greater than zero) and indicate that the duty cycle of system clock 108 needs to be increased, and DCC code 130 can include a value to increase the duty cycle of system clock 108.

If system clock 108 has a duty cycle that is greater than 50%, then Code A in the first step can be decreased from (e.g., earlier than) the mid-code of range 202 and Code B in the second step can be increased from (later than) the mid-code of range 302. Therefore, when system clock 108 has the duty cycle greater than 50%, the difference Code A−Code B can be a negative number (e.g., less than zero) and indicate that the duty cycle of system clock 108 needs to be decreased, and DCC code 130 can include a value to decrease the duty cycle of system clock 108.

In an aspect, the 2-step calibration process described herein can accommodate duty cycle distortions from phase shifters 116, 118. By way of example, the duty cycle distortions from phase shifters 116, 118 can be added equally to Code A and Code B and eventually be cancelled out by processor 104 during determination of DCC code 130.

Figure 4:
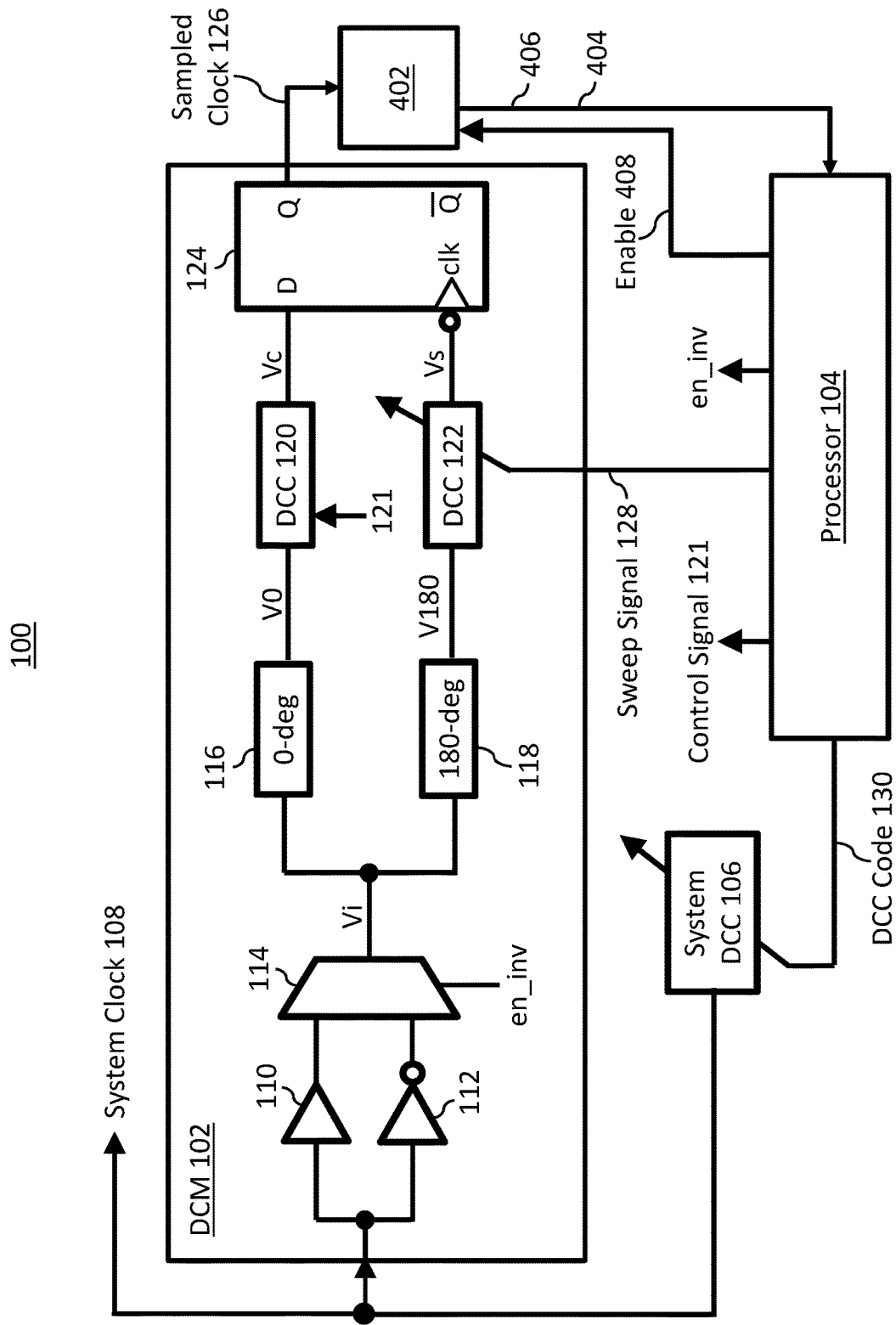
FIG. 4 is a diagram showing another example system that can implement digital duty cycle calibration in one embodiment.

FIG. 4 is a diagram showing another example system that can implement digital duty cycle calibration in one embodiment. Descriptions of FIG. 4 can reference components that are shown in FIG. 1 to FIG. 3. In an aspect, if random jitter is present in system clock 108 and if there is metastability in DFF 124, sampled clock 126*b* can be unstable when the falling edge of voltage signal Vs is almost aligned (e.g., relatively close) to the rising edge of Vc. Sampled clock 126 being unstable can degrades an accuracy of the 2-step calibration process described herein (e.g., calibration being performed by system 100 in FIG. 1). For example, Code A determined in the first step and Code B determined in the second step can be inaccurate as a result of the metastability. To mitigate the metastability issue in sampled clock 126, a multi-sample synchronizer circuit 402 can be connected between the outputs of DFF 124 and processor 104.

Multi-sample synchronizer circuit 402 can be configured to sample sampled clock 126 using a local clock signal being used by processor 104, where this local clock signal has the same frequency as voltage signal Vs. As a result of sampling the output of DFF 124 using the local clock, sampled clock 126 can be synchronized. Multi-sample synchronizer circuit 402 can output a synchronized version of sampled clock 126, labeled as a synchronized clock 404, and an indicator 406. Indicator 406 can be a signal that indicates whether sampled clock 126 has changed when multi-sample synchronizer circuit 402 is enabled by an enable signal 408 from processor 104. In one embodiment, the time for which multi-sample synchronizer circuit 402 is enabled can be programmable in order to tradeoff between the robustness of the synchronized version of sampled clock 126, the sampling indicator and calibration time.

Figure 5A:
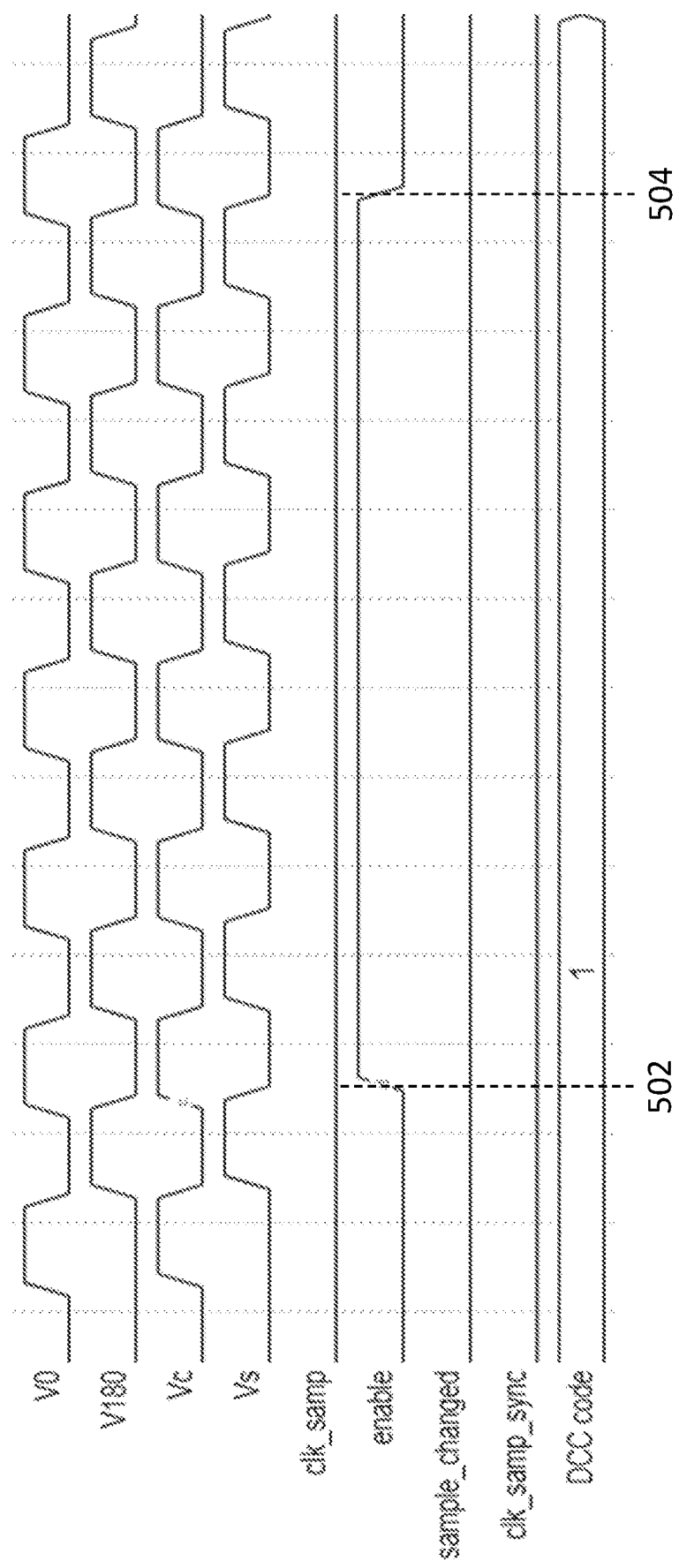
FIG. 5A is a diagram showing waveforms of an example implementation of digital duty cycle calibration in one embodiment.
Figure 5B:
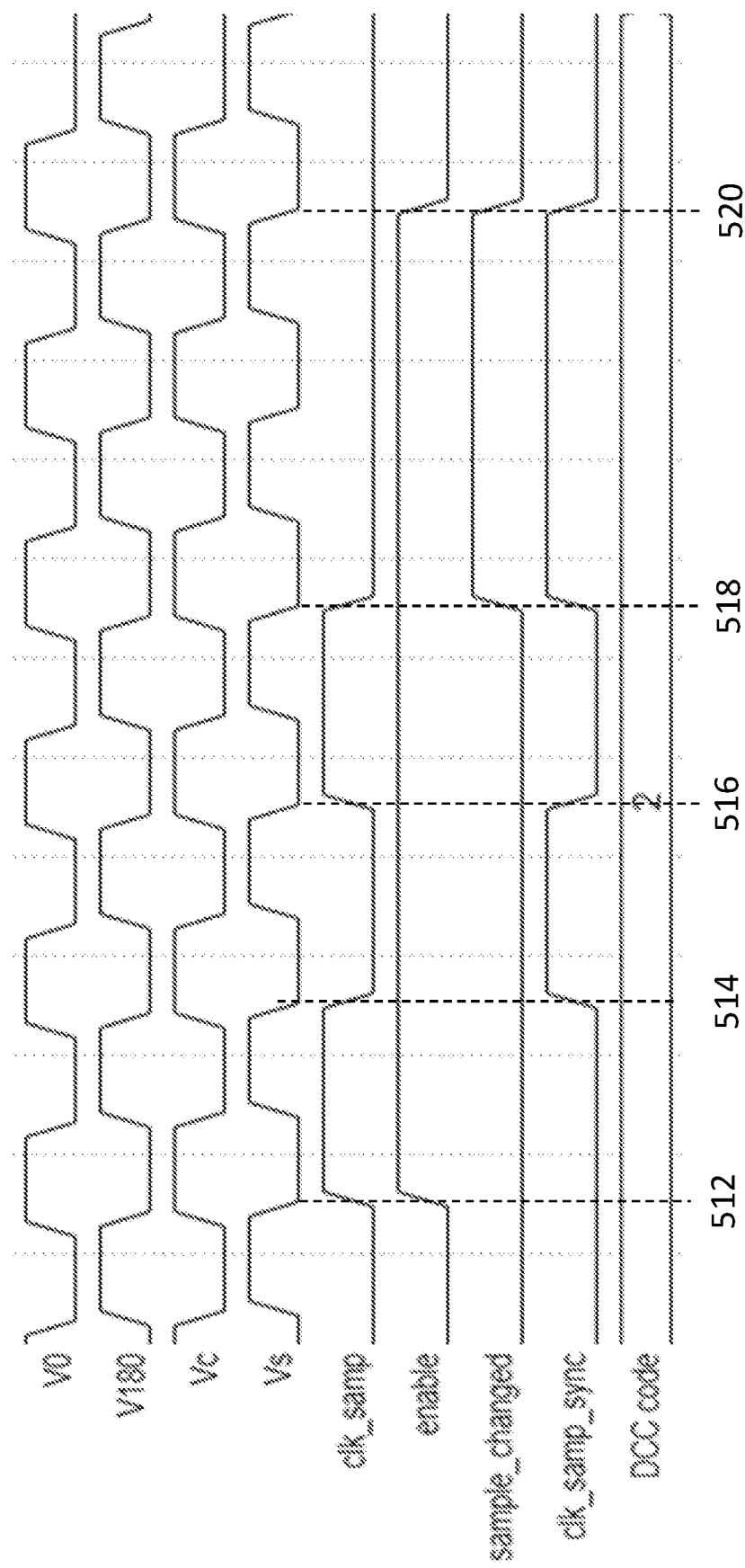
FIG. 5B is a diagram showing waveforms of the example implementation of digital duty cycle calibration in one embodiment.
Figure 5C:
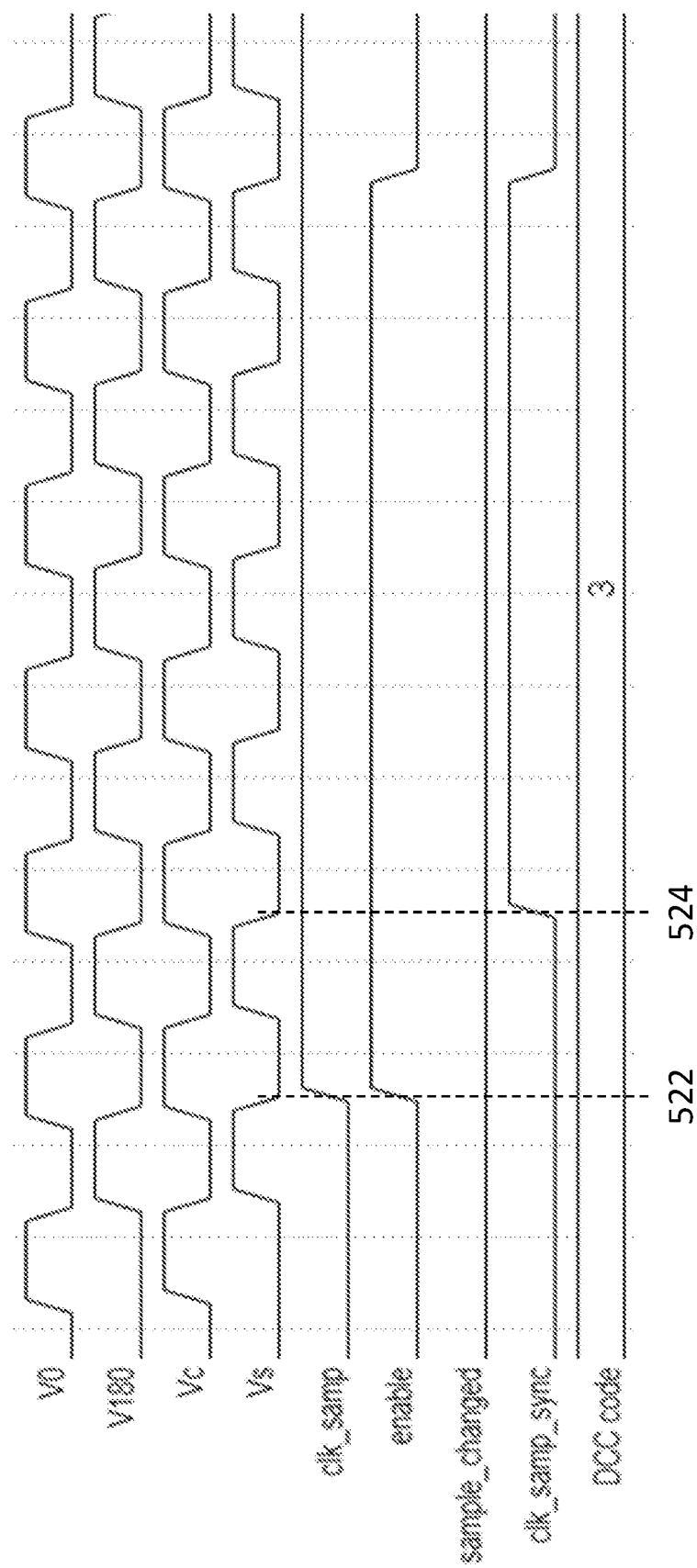
FIG. 5C is a diagram showing waveforms of the example implementation of digital duty cycle calibration in one embodiment.

FIG. 5A, FIG. 5B and FIG. 5C are diagrams showing waveforms of an example implementation of digital duty cycle calibration in one embodiment. Descriptions of FIG. 5A, FIG. 5B and FIG. 5C can reference components that are shown in FIG. 1 to FIG. 4. In one embodiment, processor 104 can generate sweep signal 128 by identifying DCC codes that define a sweeping range (e.g., ranges 202, 302) in the first step and the second step of the 2-step calibration process described herein. In one embodiment, the sweeping range can be dependent on synchronized clock 404 and indicator 406.

In one embodiment, processor 104 can determine a lower bound DCC code and an upper bound DCC code. The lower bound DCC code can be the last or the largest duty cycle code which satisfies the condition of synchronized clock 404 being zero or low and indicator 406 being zero or low. The upper bound DCC code can be the first or the smallest duty cycle code which satisfies the condition of synchronized clock 404 being one or high and indicator 406 being zero or low. In one embodiment, indicator 406 being zero can indicate that sampled clock 126 is stably keeping one state rather than changing between low and high state.

In one embodiment, processor 104 can start the sweep from an arbitrary starting DCC code, such as mid-code, and processor can perform the sweep differently under different conditions that can be based on synchronized clock 404 and indicator 406 at the starting DCC code. By way of example, if synchronized clock 404 is zero and indicator 406 is zero at the starting DCC code of a starting duty cycle, then processor 104 can continue to perform the sweep by incrementing the DCC code of DCC circuit 122 until the upper bound DCC code that satisfies the condition that synchronized clock 404 is one and indicator 406 is zero is identified. In response to a specific duty cycle satisfying the condition that synchronized clock 404 is one and indicator 406 is zero, the DCC code of the specific duty cycle can be set as an ending duty cycle of the sweep and the sweep can be performed that starts at the starting duty cycle code and ends at the specific duty cycle.

By way of example, if synchronized clock 404 is one and indicator 406 is zero at the starting DCC code, then processor 104 can continue to perform the sweep by decrementing the DCC code of DCC circuit 122 until the lower bound satisfies the condition that synchronized clock 404 is zero and indicator 406 is zero. In response to a specific duty cycle satisfying the condition that synchronized clock 404 is zero and indicator 406 is zero, the DCC code of the specific duty cycle can be set as an ending duty cycle of the sweep and the sweep can be performed that starts at the starting duty cycle code and ends at the specific duty cycle.

By way of example, if indicator 406 is one at the starting DCC code, regardless of the state of synchronized clock 404, then processor 104 can continue to perform the sweep by incrementing the DCC code of DCC circuit 122 until the upper bound DCC code that satisfies the condition that synchronized clock 404 is one and indicator 406 is zero is identified. Then, processor 104 can decrement the DCC code of DCC circuit 122 until the lower bound DCC code that satisfies the condition that synchronized clock 404 is zero and indicator 406 is zero is identified. In response to a specific duty cycle satisfying the condition that synchronized clock 404 is one and indicator 406 is zero, the DCC code of the specific duty cycle can be set as an ending duty cycle of the sweep and the sweep can be performed that starts at the starting duty cycle code and ends at the specific duty cycle.

In an example starting from FIG. 5A, a starting DCC code for a sweep of DCC circuit 122 can be '1'. At a time 502, multi-sample synchronizer circuit 402 can be enabled by processor 104. In response to multi-sample synchronizer circuit 402 being enabled, synchronized clock 404 and indicator 406 both remain at zero. Therefore, the starting DCC code of '1' can be identified by processor 104 as the lower bound DCC code. Processor 104 can disable multi-sample synchronizer circuit 402 at a time 504 to change the DCC code to a next DCC code '2'.

The example can continue in FIG. 5B. In FIG. 5B, the sweep moved on to a next DCC code of '2'. At a time 512, multi-sample synchronizer circuit 402 can be enabled by processor 104. At a time 514, the rising edge of synchronized clock 404 can be triggered and indicator 406 can remain at zero, indicating that the DCC code '2' can potentially be an upper bound DCC code. In order to determine whether the DCC code '2' is truly an upper bound DCC code or not, processor 104 can sweep additional codes to check whether synchronized clock 404 remains at one and indicator 406 remains at zero. At time 516, synchronized clock 404 and indicator 406 both become zero. Since the DCC code '1' is already identified by processor 104 as the lower bound DCC code, processor 104 can continue the sweep despite both synchronized clock 404 and indicator 406 being zero. At time 518, the rising edges of synchronized clock 404 and indicator 406 can be triggered, and can remain at one until time 520 when processor 104 disables multi-sample synchronizer 402 to change the DCC code to a next DCC code '3'.

The example can continue in FIG. 5C. In FIG. 5C, the sweep moved on to a next DCC code of '3'. At a time 522, multi-sample synchronizer circuit 402 can be enabled by processor 104. At time 524, the rising edge of synchronized clock 404 can be triggered and indicator 406 can remain at zero. In response to synchronized clock 404 remaining at one and indicator 406 remaining at zero, processor 104 can identify the DCC code '3' as the upper bound DCC code.

In one embodiment, in the first step of the 2-step calibration process described herein, processor 104 can determine Code A by dividing a sum of the lower bound and the upper bound DCC codes, determined in the sweep in the first step, by 2. In other words, Code A=(lower bound+upper bound)/2 in the first step. Also, in the second step of the 2-step calibration process described herein, processor 104 can determine Code B by dividing a sum of the lower bound and the upper bound DCC codes, determined in the sweep of the second step, by 2. In other words, Code B=(lower bound+upper bound)/2 in the second step. The determination of Code A and Code B using the lower bound and upper bound DCC codes from the first and second steps can address metastability of DFF 124 and improve an accuracy of system 100.

Figure 6:
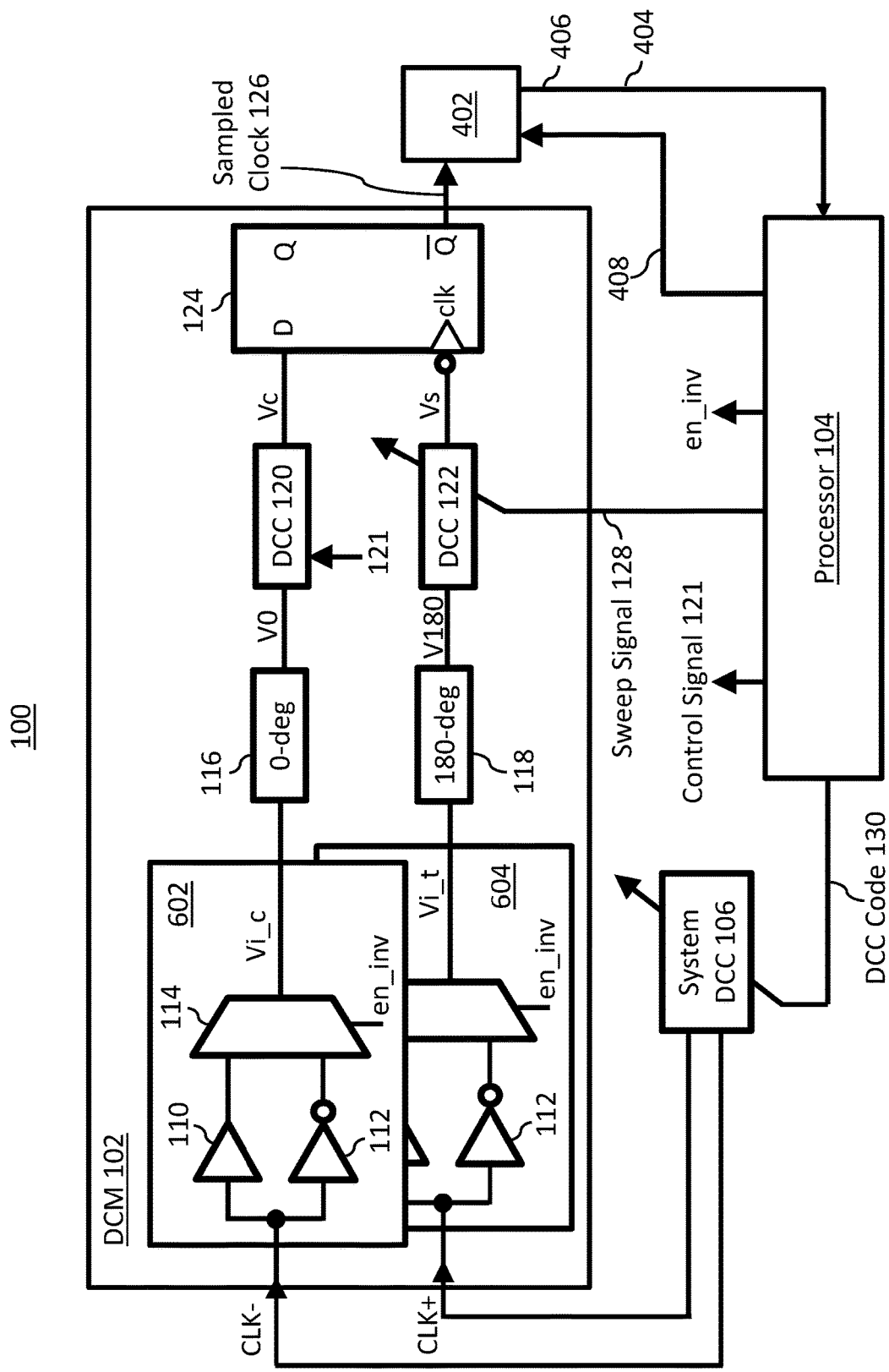
FIG. 6 is a diagram showing waveforms of another implementation of digital duty cycle calibration in one embodiment.

FIG. 6 is a diagram showing waveforms of another implementation of digital duty cycle calibration in one embodiment. Descriptions of FIG. 6 can reference components that are shown in FIG. 1 to FIG. 5C. In one embodiment, system 100 can be configured to perform the system clock calibration described herein on differential clock signals. In one embodiment, system clock 108 can be a differential clock signal including a positive signal Clk+ and negative signal Clk−.

In the embodiment shown in FIG. 6, the negative signal CLK− can be distributed to buffer 110 and inverter 112 in a first circuit or segment 602. MUX 114 in segment 602 can output either the negative signal CLK− or an inverse of CLK− as a voltage signal Vi_c. Voltage signal Vi_c can be fed into phase shifter 116. Phase shifter 116 can generate voltage signal V0 based on voltage signal Vi_c. Voltage signal V0 can be fed into DCC circuit 120. DCC circuit 120 can perform duty cycle control using control signal 121 on voltage signal V0 to generate voltage signal Vc.

The positive signal CLK+ can be distributed to buffer 110 and inverter 112 in a second circuit or segment 604. MUX 114 in segment 604 can output either the positive signal CLK+ or an inverse of CLK+ as a voltage signal Vi_c. Voltage signal Vi_t can be fed into phase shifter 118. Phase shifter 118 can generate voltage signal V180 based on voltage signal Vi_t. Voltage signal V180 can be fed into DCC circuit 122 and DCC circuit 122 can perform the calibration sweep using sweep signal 128 on voltage signal V180 to generate voltage signal Vs.

Voltage signals Vc and Vs can be fed into DFF 124. DFF 124 can output sampled clock 126 from the Q-not output. In an aspect, comparing the different clock embodiment in FIG. 6 to the single-ended clock signal embodiment shown in FIG. 1 and FIG. 4, the polarity of the sampled clock 126 can be inverted since detection of Code A and Code B is performed by locating Vc's falling edge instead of the rising edge.

Figure 7A:
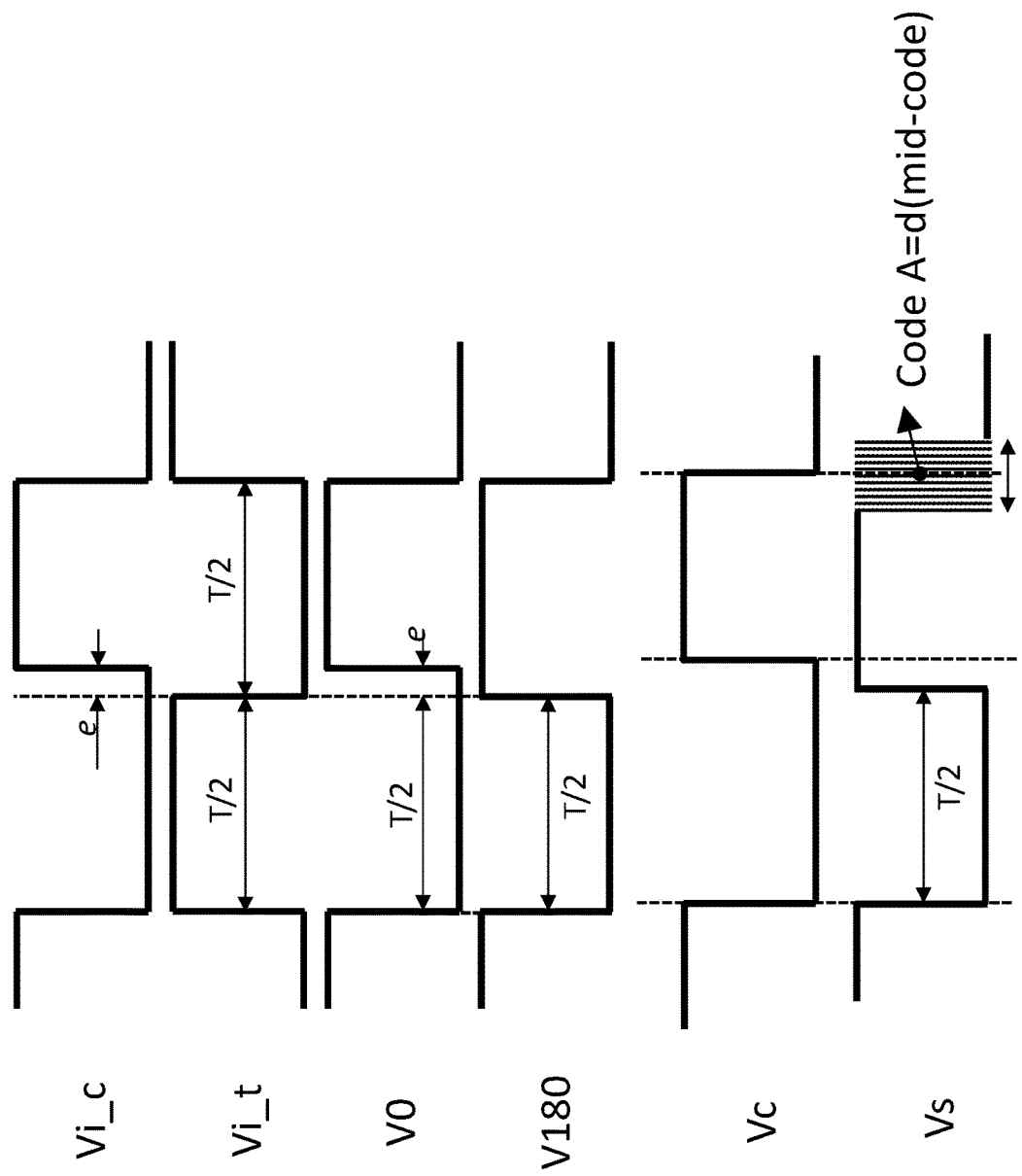
FIG. 7A is a diagram showing waveforms of an example implementation of digital duty cycle calibration in one embodiment.
Figure 7B:
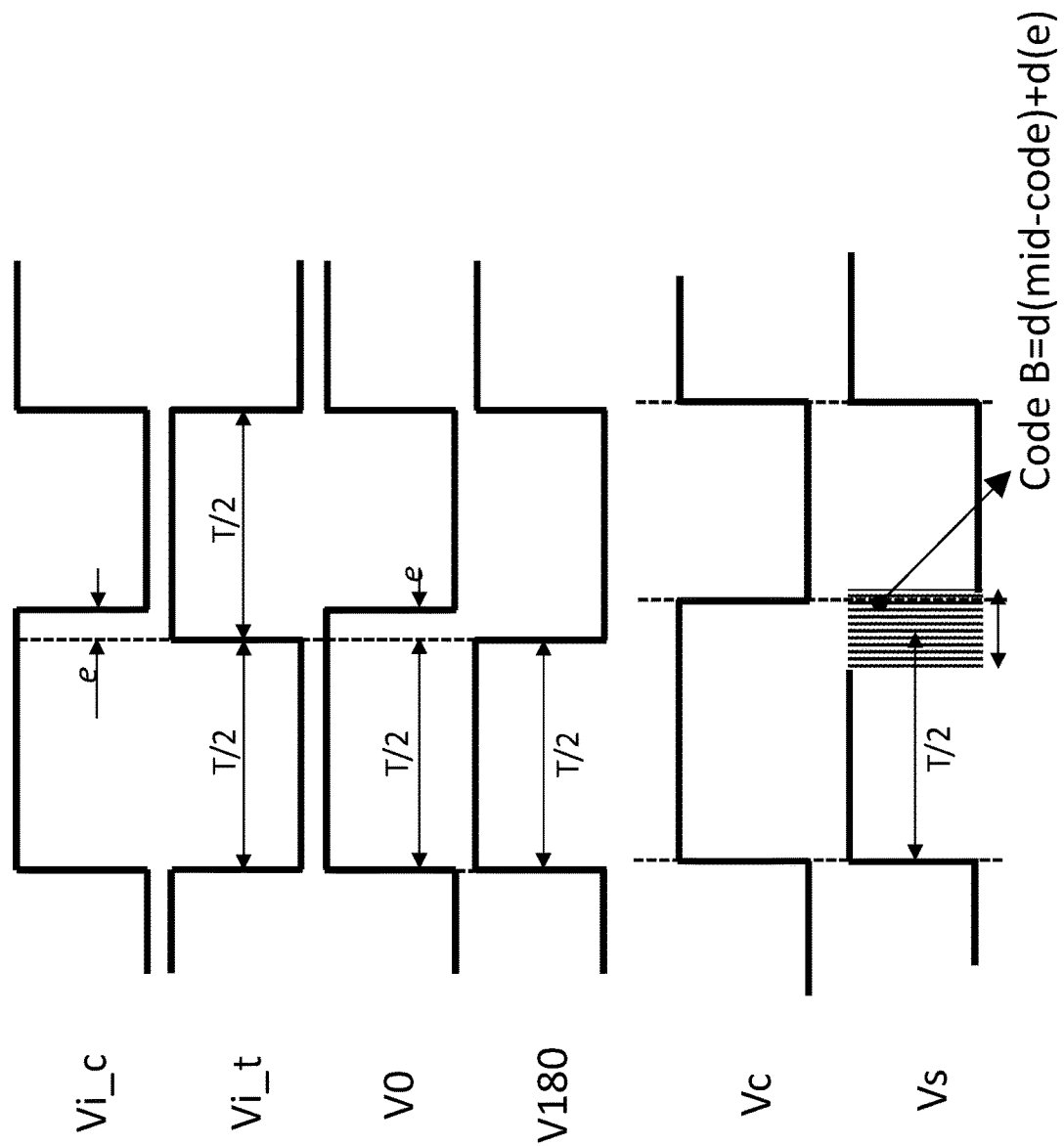
FIG. 7B is a diagram showing waveforms of the example implementation shown in FIG. 7A in one embodiment.

FIG. 7A and FIG. 7B are diagrams showing waveforms of an example implementation of digital duty cycle calibration in one embodiment. Descriptions of FIG. 7A and FIG. 7B can reference components that are shown in FIG. 1 to FIG. 6. A plurality of waveforms shown in FIG. 7A and FIG. 7B are results from an implementation of system 100 shown in FIG. 6, where the negative signal CLK− has a duty cycle distortion (DCD), such as having a duty cycle of [100*(T/2−e)/T]%, and the positive signal CLK+ has an ideal 50% duty cycle (e.g., the differential duty cycle between CLK− and CK+ is greater than 50%).

FIG. 7A is directed to the first step of the 2-step calibration process described herein, where the MUX 114 in segments 602, 604 selects the output of buffer 110. In FIG. 7A, voltage signal Vi_c can be identical to the negative signal CLK− and voltage signal Vi_t can be identical to the positive signal CLK+. The falling edges of voltage signals Vc and Vs are aligned, thus Code A=d(mid-code) can be recorded by processor 104.

FIG. 7B is directed to the second step of the 2-step calibration process described herein, where the MUX 114 in segments 602, 604 selects the output of inverter 112. In FIG. 7B, voltage signal Vi_c can be identical to the inverse of negative signal CLK− and voltage signal Vi_t can be identical to the inverse of positive signal CLK+. Also, in FIG. 7B, the starting duty cycle to sweep the falling edge of voltage signal Vs can be earlier, by a factor of e, from the mid-point. This Code B can be recorded by processor 104 as d(mid-code)+d(e). For the embodiment shown in FIG. 7A and FIG. 7B, processor 104 can determine DCC code 130 as (Code A−Code B)/2=−d(e)/2, which can compensate for differential duty cycle between CLK− and CLK+ that is greater than 50%.

Figure 8A:
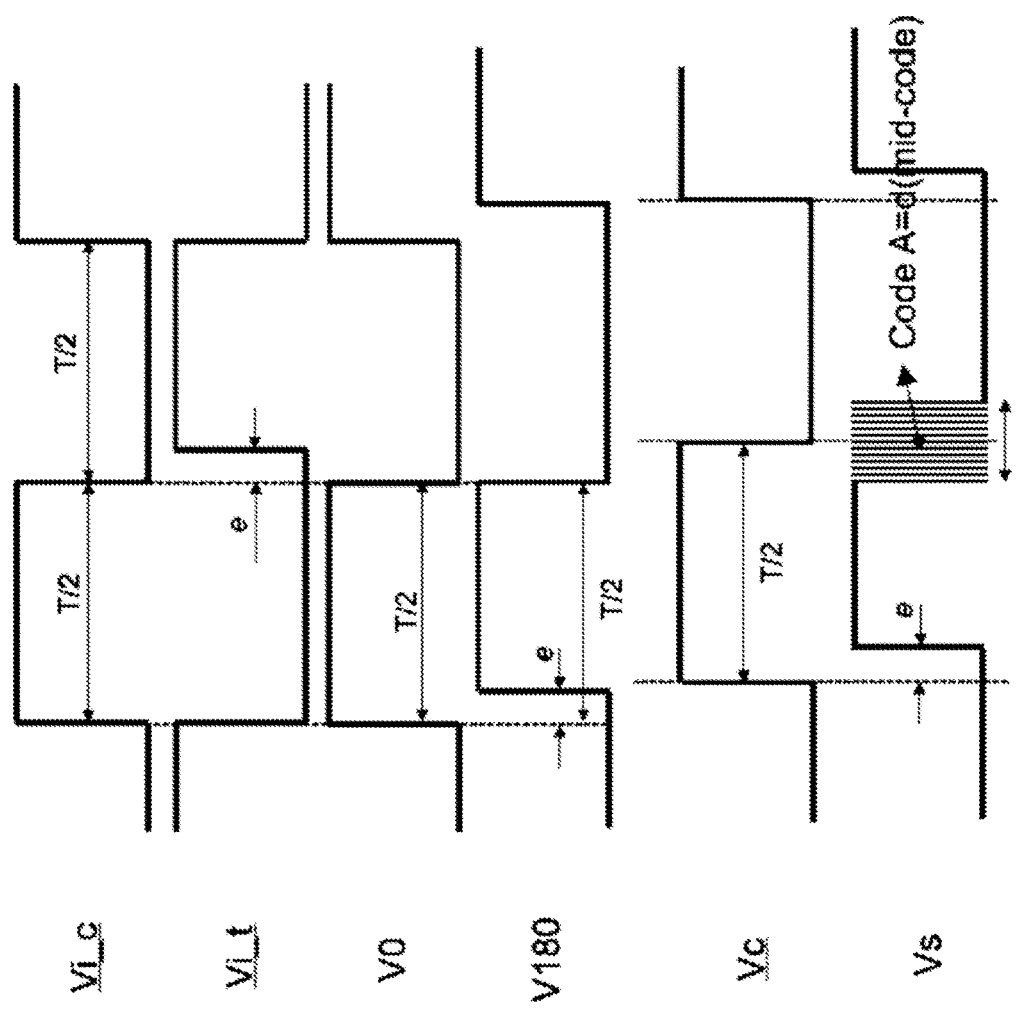
FIG. 8A is a diagram showing waveforms of another example implementation of digital duty cycle calibration in one embodiment.
Figure 8B:
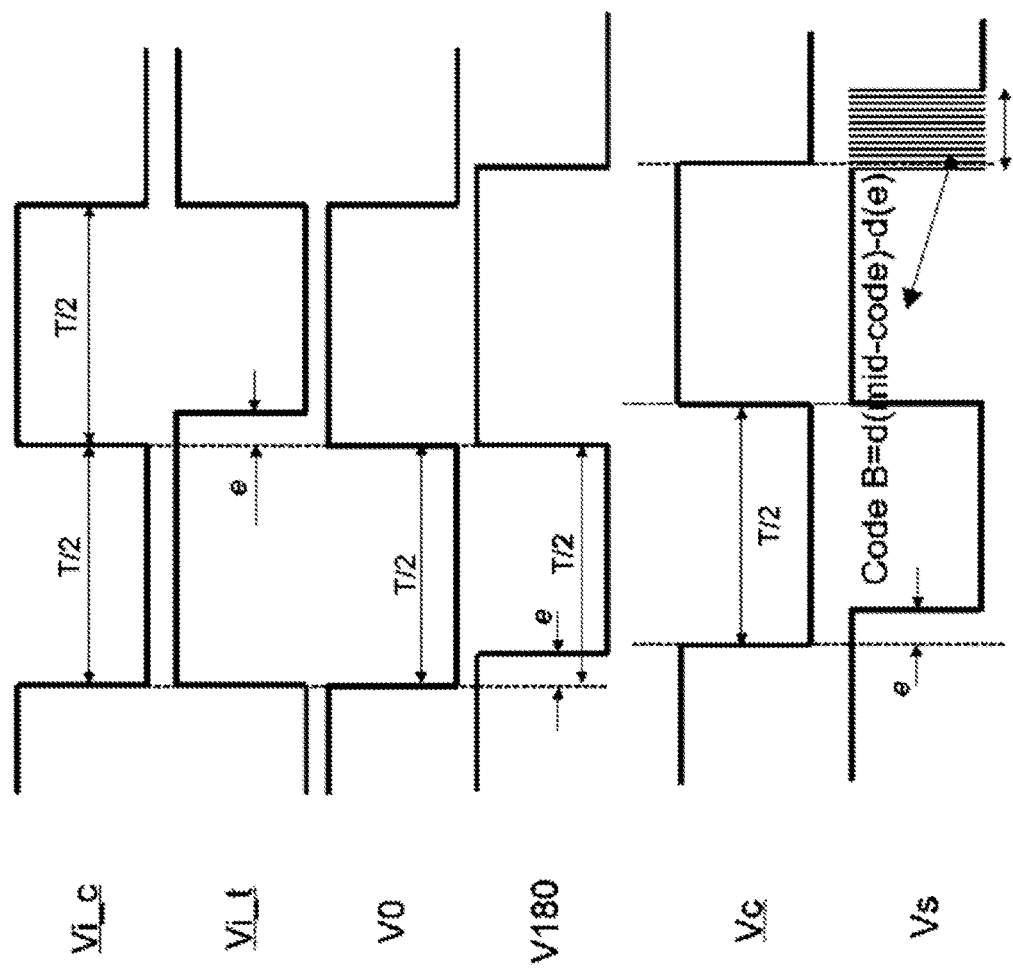
FIG. 8B is a diagram showing waveforms of the example implementation shown in FIG. 8A in one embodiment.

FIG. 8A and FIG. 8B are diagrams showing waveforms of another example implementation of digital duty cycle calibration in one embodiment. Descriptions of FIG. 8A and FIG. 8B can reference components that are shown in FIG. 1 to FIG. 7B. A plurality of waveforms shown in FIG. 8A and FIG. 8B are results from an implementation of system 100 shown in FIG. 6, where the negative signal CLK− has an ideal 50% duty cycle and the positive signal CLK+ has a DCD, such as having a duty cycle of [100*(T/2−e)/T]%, (e.g., the differential duty cycle between CLK− and CK+ is less than 50%).

FIG. 8A is directed to the first step of the 2-step calibration process described herein, where the MUX 114 in segments 602, 604 selects the output of buffer 110. In FIG. 8A, voltage signal Vi_c can be identical to the negative signal CLK− and voltage signal Vi_t can be identical to the positive signal CLK+. The falling edges of voltage signals Vc and Vs are aligned, thus Code A=d(mid-code) can be recorded by processor 104.

FIG. 8B is directed to the second step of the 2-step calibration process described herein, where the MUX 114 in segments 602, 604 selects the output of inverter 112. In FIG. 8B, voltage signal Vi_c can be identical to the inverse of negative signal CLK− and voltage signal Vi_t can be identical to the inverse of positive signal CLK+. Also, in FIG. 8B, the starting duty cycle to sweep the falling edge of voltage signal Vs can be later, by a factor of e, from the mid-point. This, Code B can be recorded by processor 104 as d(mid-code)−d(e). For the embodiment shown in FIG. 8A and FIG. 8B, processor 104 can determine DCC code 130 as (Code A−Code B)/2=+d(e)/2, which can compensate for differential duty cycle between CLK− and CLK+ that is less than 50%.

Figure 9:
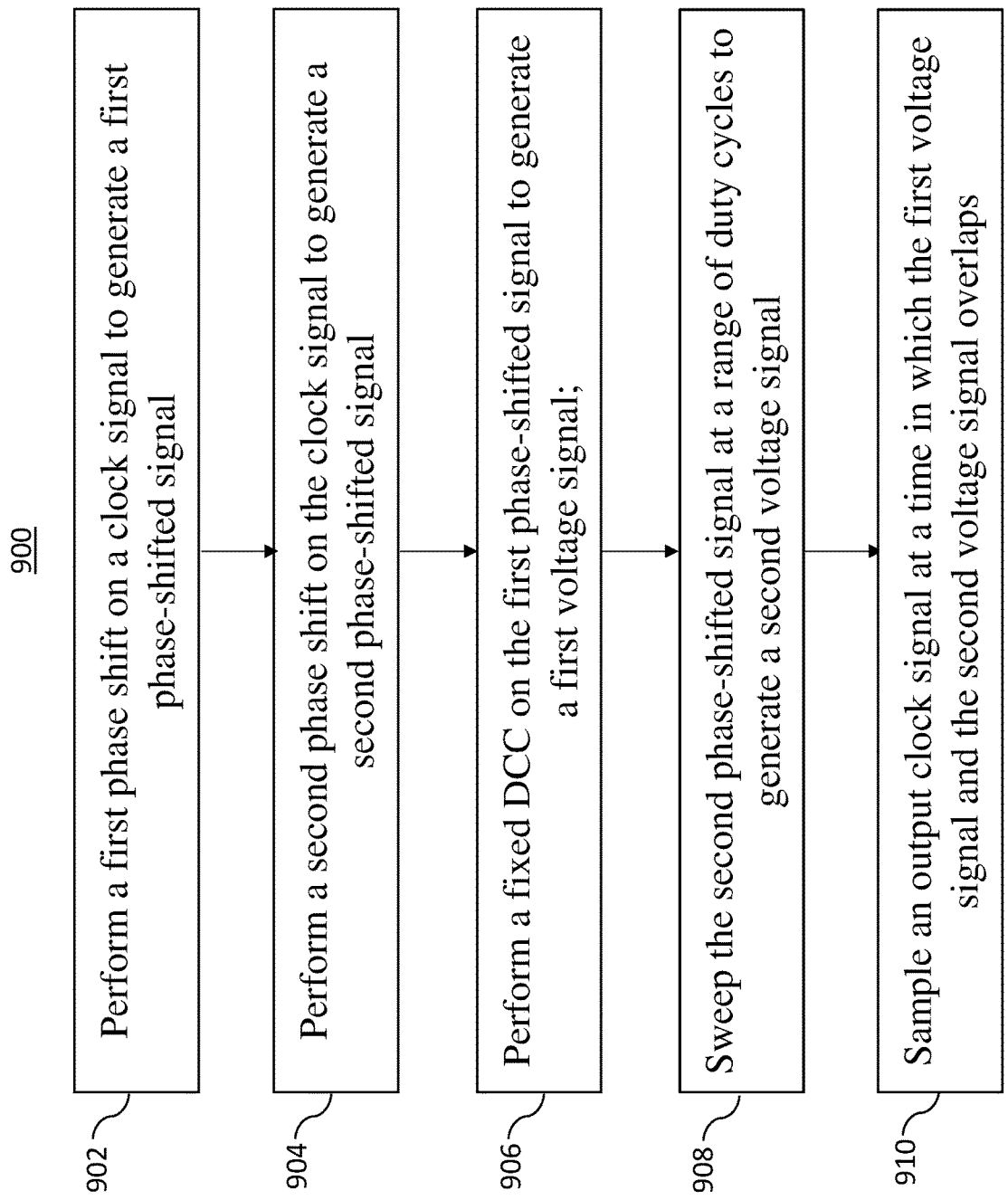
FIG. 9 is a flow diagram illustrating a process for implementing digital duty cycle calibration in one embodiment.

FIG. 9 is a flow diagram illustrating a process for implementing digital duty cycle calibration in one embodiment. The process can include one or more operations, actions, or functions as illustrated by one or more of blocks 902, 904, 906, 908, and/or 910. Although illustrated as discrete blocks, various blocks can be divided into additional blocks, combined into fewer blocks, eliminated, performed in different order, or performed in parallel, depending on the desired implementation.

Process 900 can be performed by a digital duty cycle calibration system using one or more DCMs. Process 900 can begin at block 902, where the calibration system can perform a first phase shift on a clock signal to generate a first phase-shifted signal. The process 900 can continue from block 902 to block 904. At block 904, the calibration system can perform a second phase shift on the clock signal to generate a second phase-shifted signal. In one embodiment, the first phase shift can be a 0-degree phase shift and further, the second phase shift can be a 180-degree phase shift. In one embodiment, the clock signal can be one of a single-ended clock signal and a differential clock signal.

The process 900 can continue from block 904 to block 906. At block 906, the calibration system can perform a fixed DCC on the first phase-shifted signal to generate a first voltage signal. The process 900 can continue from block 906 to block 908. At block 908, the calibration system can sweep the second phase-shifted signal at a range of duty cycles to generate a second voltage signal.

In one embodiment, the calibration system can perform the fixed DCC on the clock signal based on a control signal that includes a fixed DCC code. The calibration system can further sweep the second phase-shifted signal based on a sweep signal that includes a plurality of DCC codes corresponding to the range of duty cycles.

In another embodiment, the calibration system can perform the first phase shift on an inverse of the clock signal to generate a third phase-shifted signal. The calibration system can further perform the second phase shift on the inverse of the clock signal to generate a fourth phase-shifted signal. The calibration system can further perform the fixed DCC on the third phase-shifted signal to generate a third voltage signal. The calibration system can further sweep the fourth phase-shifted signal at another range of duty cycles to generate a fourth voltage signal. The calibration system can further sample another output clock signal at a time in which the third voltage signal and the fourth voltage signal overlaps. The calibration of the clock signal is based on the output clock signal and said another output clock signal.

The process 900 can continue from block 908 to block 910. At block 910, the calibration system can sample an output clock signal at a time in which the first voltage signal and the second voltage signal overlaps. The calibration of the clock signal can be based on the output clock signal. In another embodiment, the first phase shift can be a 0-degree phase shift and further, the second phase shift can be a 180-degree phase shift.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A semiconductor device comprising:
a processor;
a system duty cycle control (DCC) circuit configured to generate a clock signal; and
a circuit configured to:
perform a first phase shift on a clock signal to generate a first phase-shifted signal;
perform a second phase shift on the clock signal to generate a second phase-shifted signal;
perform a fixed DCC on the first phase-shifted signal to generate a first voltage signal;
sweep the second phase-shifted signal at a range of duty cycles to generate a second voltage signal; and
sample an output clock signal at a time in which the first voltage signal and the second voltage signal overlaps;
the processor being configured to generate a digital code based on the output clock signal, and
the system DCC circuit being configured to calibrate the clock signal using the digital code.

2. The semiconductor device of claim 1, wherein the processor is configured to:
generate a control signal that includes a fixed DCC code for the circuit to perform the fixed DCC on the clock signal; and
generate a sweep signal that includes a plurality of DCC codes for the circuit to sweep the phase-shifted signal.

3. The semiconductor device of claim 1, wherein:
the circuit is configured to:
perform the first phase shift on an inverse of the clock signal to generate a third phase-shifted signal;
perform the second phase shift on the inverse of the clock signal to generate a fourth phase-shifted signal;
perform the fixed DCC on the third phase-shifted signal to generate a third voltage signal;
sweep the fourth phase-shifted signal at another range of duty cycles to generate a fourth voltage signal; and
sample another output clock signal at a time in which the third voltage signal and the fourth voltage signal overlaps;
the processor being configured to generate another digital code based on said another output clock signal; and
the system DCC circuit being configured to calibrate the clock signal using the digital code and said another digital code.

4. The semiconductor device of claim 3, wherein the processor is configured to:
determine a DCC code based a difference between the digital code and said another digital code output clock signal; and
send the DCC code to the system DCC circuit,
the system DCC circuit being configured to calibrate the clock signal using the DCC code.

5. The semiconductor device of claim 4, wherein the system DCC circuit is configured to:
in response to the difference being greater than zero, increase a duty cycle of the clock signal; and
in response to the difference being less than zero, decrease a duty cycle of the clock signal.

6. The semiconductor device of claim 1, further comprising a synchronizer circuit configured to synchronize the sampled output clock signal with the second voltage signal.

7. The semiconductor device of claim 6, wherein the range of duty cycles depends on the synchronized sampled output clock signal.

8. The semiconductor device of claim 1, wherein:
the first phase shift is a 0-degree phase shift; and
the second phase shift is a 180-degree phase shift.

9. The semiconductor device of claim 1, wherein the clock signal is one of:
a single-ended clock signal; and
a differential clock signal.

10. A semiconductor device comprising:
a first phase shifter configured to perform a first phase shift on a clock signal to generate a first phase-shifted signal;
a second phase shifter configured to perform a second phase shift on the clock signal to generate a second phase-shifted signal;
a first duty cycle control (DCC) circuit configured to perform a fixed DCC on the first phase-shifted signal to generate a first voltage signal;
a second DCC circuit configured to sweep the second phase-shifted signal at a range of duty cycles to generate a second voltage signal; and
a phase detector configured to sample an output clock signal at a time in which the first voltage signal and the second voltage signal overlaps, wherein a calibration of the clock signal is based on the output clock signal.

11. The semiconductor device of claim 10, wherein:
the first DCC circuit is configured to perform the fixed DCC on the clock signal based on a control signal that includes a fixed DCC code; and
the second DCC circuit is configured to sweep the second phase-shifted signal based on a sweep signal that includes a plurality of DCC codes corresponding to the range of duty cycles.

12. The semiconductor device of claim 10, wherein:
the first phase shifter is configured to perform the first phase shift on an inverse of the clock signal to generate a third phase-shifted signal;
the second phase shifter is configured to perform the second phase shift on the inverse of the clock signal to generate a fourth phase-shifted signal;
the first DCC circuit is configured to perform the fixed DCC on the third phase-shifted signal to generate a third voltage signal;
the second DCC circuit is configured to sweep the fourth phase-shifted signal at another range of duty cycles to generate a fourth voltage signal; and
the phase detector is configured to sample another output clock signal at a time in which the third voltage signal and the fourth voltage signal overlaps, wherein the calibration of the clock signal is based on the output clock signal and said another output clock signal.

13. The semiconductor device of claim 10, wherein the range of duty cycles depends on a synchronized version of the output clock signal.

14. The semiconductor device of claim 10, wherein:
the first phase shift is a 0-degree phase shift; and
the second phase shift is a 180-degree phase shift.

15. The semiconductor device of claim 10, wherein the clock signal is one of:
a single-ended clock signal; and
a differential clock signal.

16. A method for calibrating a clock signal, the method comprising:
performing a first phase shift on a clock signal to generate a first phase-shifted signal;

performing a second phase shift on the clock signal to generate a second phase-shifted signal;

performing a fixed DCC on the first phase-shifted signal to generate a first voltage signal;

sweeping the second phase-shifted signal at a range of duty cycles to generate a second voltage signal; and sampling an output clock signal at a time in which the first voltage signal and the second voltage signal overlaps, wherein a calibration of the clock signal is based on the output clock signal.

17. The method of claim 16, further comprising:

performing the fixed DCC on the clock signal based on a control signal that includes a fixed DCC code; and sweeping the second phase-shifted signal based on a sweep signal that includes a plurality of DCC codes corresponding to the range of duty cycles.

18. The method of claim 16, further comprising:

performing the first phase shift on an inverse of the clock signal to generate a third phase-shifted signal;

performing the second phase shift on the inverse of the clock signal to generate a fourth phase-shifted signal;

performing the fixed DCC on the third phase-shifted signal to generate a third voltage signal;

sweeping the fourth phase-shifted signal at another range of duty cycles to generate a fourth voltage signal; and sampling another output clock signal at a time in which the third voltage signal and the fourth voltage signal overlaps, wherein the calibration of the clock signal is based on the output clock signal and said another output clock signal.

19. The method of claim 16, wherein:

the first phase shift is a 0-degree phase shift; and the second phase shift is a 180-degree phase shift.

20. The method of claim 16, wherein the clock signal is one of:

a single-ended clock signal; and a differential clock signal.

* * * * *